United States Patent
Meany

(10) Patent No.: US 8,428,372 B2
(45) Date of Patent: Apr. 23, 2013

(54) METHOD, APPARATUS AND COMPUTER PROGRAM PRODUCT FOR COMPRESSING DATA

(75) Inventor: James Joseph Meany, Des Peres, MO (US)

(73) Assignee: The Boeing Company, Chicago, IL (US)

( * ) Notice: Subject to any disclaimer, the term of this patent is extended or adjusted under 35 U.S.C. 154(b) by 424 days.

(21) Appl. No.: 12/757,390

(22) Filed: Apr. 9, 2010

(65) Prior Publication Data

US 2011/0249894 A1 Oct. 13, 2011

(51) Int. Cl.
*G06K 9/36* (2006.01)
(52) U.S. Cl.
USPC ............ 382/232; 382/233; 382/236; 382/238
(58) Field of Classification Search .................. 382/232, 382/233, 238, 166, 159, 160, 155, 156, 228, 382/236; 375/262, 341; 702/19; 435/6.11; 714/795
See application file for complete search history.

(56) References Cited

U.S. PATENT DOCUMENTS

| | | | |
|---|---|---|---|
| 5,680,129 A | 10/1997 | Weinberger et al. | |
| 5,850,482 A | 12/1998 | Meany et al. | |
| 6,539,122 B1 | 3/2003 | Abousleman | |
| 7,454,293 B2 * | 11/2008 | Okimoto et al. | 702/19 |
| 7,693,339 B2 * | 4/2010 | Wittenstein | 382/238 |
| 2009/0041021 A1 | 2/2009 | Meany et al. | |
| 2009/0041365 A1 | 2/2009 | Meany | |
| 2009/0232408 A1 | 9/2009 | Meany | |

FOREIGN PATENT DOCUMENTS

WO WO 2006/041261 A1 4/2006

OTHER PUBLICATIONS

"AVIRIS Home Page", printed Apr. 23, 2010, <http://aviris.jpl.nasa.gov>.
Aiazzi et al., "Crips and Fuzzy Adaptive Spectral Predictions for Lossless and Near-Lossless Compression of Hyperspectral Imagery," *IEEE Geoscience and Remote Sensing Letters*, vol. 4, No. 4, Oct. 2007, pp. 532-536.
Brower et al., "Multiple Component Compression Within JPEG 2000 as Compared to Other Techniques," *Applications of Digital Image Processing XXIII, Proceedings of SPIE*, vol. 4115, 2000, pp. 544-551.
Effros, Michelle, "Optimal Modeling for Complex System Design," *IEEE Signal Processing Magazine*, Nov. 1998, pp. 51-73.
Gotsman et al., "On the Metric Properties of Discrete Space-Filling Curves," *IEEE Transactions on Image Processing*, vol. 5, No. 5, May 1996, pp. 794-797.
Huang et al., "Lossless Compression of Hyperspectral Imagery via Lookup Tables with Predictor Selection," *Image and Signal Processing for Remote Sensing XII, Proceedings of SPIE*, vol. 6365 63650L, 2006, pp. 1-8.

(Continued)

*Primary Examiner* — Anh Hong Do
(74) *Attorney, Agent, or Firm* — Alston & Bird LLP

(57) ABSTRACT

A method, apparatus and computer program product are provided for compressing data in a manner that decorrelates a plurality of components of multicomponent data and then encodes data relating to decorrelation of the components. The components may be decorrelated by organizing samples of a component into classes based upon values of samples having corresponding spatial locations in at least one preceding component. In this regard, the organization of samples of a component into classes may include defining classes based upon values of the samples in at least one preceding component. In addition, the method may also define classes based upon the slope of the samples in at least two preceding component.

20 Claims, 10 Drawing Sheets

OTHER PUBLICATIONS

Kasner et al., "JPEG-2000 Compression Using 3D Wavelets and KLT with Application to HYDICE Data," *Imaging Spectrometry VI, Proceedings of SPIE*, vol. 4132, 2000,pp. 157-166.

Magli, Enrico, "Multiband Lossless Compression of Hyperspectral Images," *IEEE Transactions on Geoscience and Remote Sensing*, vol. 47, No. 4, Apr. 2009, pp. 1168-1178.

Meany, James J., "Split Field Coding: Low Complexity, Error-Resilient Entropy Coding for Image Compression," *Applications of Digital Image Processing XXXI, Proceedings of SPIE*, vol. 7073 707316, 2008, pp. 1-16.

Memon et al., "An Analysis of Some Common Scanning Techniques for Lossless Image Coding," *IEEE Transactions on Image Processing*, vol. 9, No. 11, Nov. 2000, pp. 1837-1848.

Mielikainen et al., "Clustered DPCM for the Lossless Compression of Hyperspectral Images," *IEEE Transactions on Geoscience and Remote Sensing*, vol. 41, No. 12, Dec. 2003, pp. 2943-2946.

Mielikainen et al., "Lossless Hyperspectral Image Compression via Linear Prediction," *Algorithms and Technologies for Multispectral, Hyperspectral, and Ultraspectral Imagery VIII, Proceedings of SPIE*, vol. 4725, 2002, pp. 600-608.

Shen et al., "Effects of 3D Wavelets and KLT Based JPEG-2000 Hyperspectral Compression on Exploitation," *Imaging Spectrometry VI, Proceedings of SPIE*, vol. 4132, 2000, pp. 167-176.

Shen et al., "Effects Hyperspectral Compression on Nonliteral Exploitation," *SPIE Conference on Imaging Spectrometry IV*, San Diego, CA, Jul. 1998, vol. 3438, pp. 191-199.

Shen, Sylvia S., "Multiband Sensor System Design Tradeoffs and Their Effects on Remote Sensing and Exploitation," *SPIE*, vol. 3118, Oct. 31, 1997, pp. 296-307.

Shen et al., "New Hyperspectral Compression Options in JPEG-2000 and Their Effects on Exploitation," *Imaging Spectrometry VII, Proceedings of SPIE*, vol. 4480, 2002, pp. 154-165.

Simard et al., "On-Line Adaptation in Image Coding with a 2-D Tarp Filter," *Proceedings of the Data Compression Conference*, IEEE Computer Society, 2002, 10 pages.

Sweldens, Wim, "The Lifting Scheme: a New Philosophy in Biorthogonal Wavelet Constructions," <http://www.cse.ttu.edu.tw/~jmchen/wavelets/Tutorials/sweldens/spie95.pdf>, 1995.

Wang et al., "Three-Dimensional Tarp Coding for the Compression of Hyperspectral Images," *IEEE Geoscience and Remote Sensing Letters*, vol. 1, No. 2, Apr. 2004, pp. 136-140.

Weinberger et al., "The LOCO-I Lossless Image Compression Algorithm: Principles and Standardization into JPEG-LS," *IEEE Transactions on Image Processing*, vol. 9, No. 8, Aug. 2000, pp. 1309-1324.

Wilkinson et al., "Multi-Component Compression in JPEG2000 Part II," *Applications of Digital Image Processing XXIV, Proceedings of SPIE*, vol. 4472, 2001, pp. 224-235.

Zhang et al., "Lossy-to-Lossless Compression of Hyperspectral Imagery Using Three-Dimensional TCE and an Integer KLT," *IEEE Geoscience and Remote Sensing Letters*, vol. 5, No. 4, Oct. 2008, pp. 814-818.

Search Report from Great Britain Patent Application No. GB1105730.4, dated Aug. 4, 2011.

Jing Zhang, et al.; "A Novel Lossless Compression for Hyperspectral Images by Context-Based Adaptive Classified Arithmetic Coding in Wavelet Domain"; IEEE Geoscience and Remote Sensing Letters; Jul. 2007; vol. 4, Issue 3; pp. 461-465; INSPEC Accession No. 9960727.

Ying Hou, et al.; "Hyperspectral Image Lossy-to-Lossless Compression Using the 3D Embedded Zeroblock Coding Algorithm"; International Workshop on Earth Observation and Remote Sensing Applications; 2008; EORSA; Sep. 5, 2008; pp. 1-6; INSPEC Accession No. 10207232.

Wei Zhang, et al.; "Compression of Hyper-Spectral Images Based on Quadtree Partitioning"; $2^{nd}$ IEEE International Conference on Computer Science and Information Technology; 2009; ICCSIT 2007; Sep. 2009; pp. 421-423; INSPEC Accession No. 10868046.

Hai-Ping Wai, et al.; "Development of the Hyperspectral Image Decorrelation"; International Symposium on Photoelectronic Detection and Imaging 2007: Image Processing, SPIE; Sep. 26, 2007; vol. 6623; pp. 662315; INSPEC Accession No. 10012790.

Lee, H.S. et al.; "Hyperspectral Image Cube Compression Combining JPEG-2000 and Spectral Decorrelation"; IEEE International Geoscience and Remote Sensing Symposium; 2002; IGARSS '02; vol. 6, pp. 3317-3319; INSPEC Accession No. 7603426.

\* cited by examiner

METHOD, APPARATUS AND COMPUTER PROGRAM PRODUCT FOR COMPRESSING DATA

TECHNOLOGICAL FIELD

Embodiments of the present disclosure relate generally to the compression of data and, more particularly, to the decorrelation of the components of multicomponent data, such as spectral bands, in the context of data compression.

BACKGROUND

It is oftentimes desirable to compress data. For example, it may be desirable to compress data that has been collected by a collection platform prior to transmission of the data to a ground station or the like. Further, it may be desirable to compress data prior to archiving the data and/or prior to further disseminating the data.

For example, hyperspectral imagery data may be voluminous and, as such, is desirably compressed prior to being transmitted, stored or otherwise disseminated. In this regard, hyperspectral imaging collects a set of image planes, such as aerial views of a selected geographic area, sampled in narrow spectral bands covering one or more contiguous spectral intervals. Narrow spectral bands allow spectroscopic methods to be combined with image analysis techniques in exploitation of the remotely sensed image data. Each spectral band within a hyperspectral image collection is a complete spatial image, albeit confined to a narrow spectral band. These individual spectral bands are also sometimes referred to as spectral components or spectral planes.

A complete hyperspectral image collected over a particular area is commonly called a hyperspectral cube, and can be characterized by the dimensions S×M×N×D, where S is the number of spectral bands, M and N are the spatial dimensions, and D is the pixel depth, such as in bits per pixel. Hyperspectral images typically comprise tens to hundreds of spectral bands. For example, NASA's Airborne Visible/Infrared Imaging Spectrometer (AVIRIS) program collected 224 spectral bands at 10 nm band intervals, with typical cube dimensions of 224×614×512×16.

The use of hyperspectral imagery is becoming increasingly popular due to the introduction of new platforms for hyperspectral image collection and to improvements in computer speed and memory for handling hyperspectral data. However, the large amounts of data associated with hyperspectral imagery, e.g., 134 Mbytes for a single AVIRIS cube, pose challenges to data storage and transmission systems. Efficient compression of hyperspectral imagery is therefore of importance in order to manage transmission and storage requirements.

Hyperspectral image compression may be useful in at least two situations. Firstly, since the hyperspectral image is generally collected with an airborne platform, downlink compression must be applied on the collection platform, so that the imagery may be more efficiently transmitted to a ground station via a downlink. Downlink compression faces at least two constraints: (a) computation is constrained due to limits on size, weight, power, and execution time on the collection platforms, and (b) compression must be lossless or nearly lossless so that little or none of the collected information is lost prior to ground processing and archiving. Due to these constraints, commercial and standard image compression methods may not be readily applicable to downlink compression.

Secondly, compression may be advantageously applied at a ground station. After downlink, hyperspectral imagery is oftentimes decompressed and processed for operations such as atmospheric compensation and correction of "dead pixels". Secondary compression may then be performed so that the imagery may be more efficiently archived and/or disseminated. Secondary compression of hyperspectral imagery may be in compliance with the JPEG 2000 standard, which is being adopted by the National Imagery and Mapping Agency (NIMA). The multicomponent compression facilities defined in Part 2 of JPEG 2000 provide a flexible framework for the compression of hyperspectral imagery. This framework can support a variety of approaches for decorrelating the spectral bands, including a spectral wavelet transform, the Karhunen-Loeve (K-L) transform, simple linear prediction, and other linear transforms.

In order to compress hyperspectral imagery data, the spectral bands may initially be decorrelated based on, for example, predictive coding and/or transform coding, such as by reliance upon the K-L transform or the wavelet transform. More recently, spectral decorrelation methods may be utilized that are locally adapted, as opposed to a prediction or transform that is applied uniformly and globally across the spatial extent of the hyperspectral image. For example, a decorrelation predictor may be modified using local spatial adaptation. Alternatively, spectrally classified predictors may be utilized in which clustering algorithms are utilized to classify pixels into groups according to their spectral signature with separate adaptive linear predictors then used for each class. By exploiting the nonstationarity of the data, these more locally adapted decorrelation methods may offer improved performance relative to classical approaches that utilize stationary statistics. However, the decorrelation techniques that utilize spectrally classified predictors may suffer from increased computational and processing costs as a result of the effort to classify the pixels into spectral classes. Indeed, the classification must generally be performed off-line and typically requires one or more additional passes through the voluminous hyperspectral imaging data.

The decorrelated spectral bands may then be encoded utilizing, for example, a conventional image compression method. In this regard, for lossless compression, predictive coding methods, such as JPEG-LS, may be utilized to compress the spectral bands, while for lossy compression, wavelet methods, such as those defined by JPEG 2000, or other methods, may be implemented to compress the spectral bands.

In light of the issues associated with decorrelation, it would be desirable for providing an improved technique for compressing data, such as hyperspectral imaging data. In this regard, it would be desirable to provide an improved technique for decorrelating data, such as hyperspectral imaging data, such that the decorrelation can be performed more efficiently with lower computational and processing costs than at least some conventional approaches.

BRIEF SUMMARY

A method, apparatus and computer program product are therefore provided in accordance with embodiments of the present disclosure in order to compress data, such as hyperspectral imaging data, more efficiently. In this regard, a method, apparatus and computer program product are provided in accordance with embodiments of the present disclosure in order to decorrelate data, such as hyperspectral imaging data, in an efficient manner so as to conserve computational and processing costs.

In one embodiment, a method of compressing data is provided that decorrelates a plurality of components of multicomponent data, such as spectral bands, with a processor and then encodes data relating to decorrelation of the components. In this regard, the method may decorrelate the components by organizing samples (such as pixels) of a component into classes based upon values of samples having corresponding spatial locations in at least one preceding component. In this regard, the organization of samples of a component into classes may include defining classes based upon values of the samples in at least one preceding component with at least one class including at least two sample values. In addition, the method may also define classes based upon the slope of the samples in at least two preceding components.

The method of one embodiment may decorrelate the components by first determining residual values for each of a plurality of samples of a component (such as by computing each residual as the difference between a prediction of the value of the sample and the actual value of the sample, where the prediction is a function of the value(s) of the sample(s) having corresponding spatial locations in at least one preceding component), secondly determining a mean of the residual values for the samples of a respective class and finally offsetting the residual values for the samples of the respective class by the mean. In addition, the mean for each of a plurality of classes may be transmitted as side information. Alternatively, the mean may be estimated, such as by recursive estimation, in accordance with backward adaptive estimation, thereby avoiding transmission of the mean for each of the plurality of classes as side information. In some embodiments, the method may decorrelate the components by adapting to local spatial characteristics, including, for example, the use of scan sequences tailored to preserve locality of the backward adaptive estimation process.

In another embodiment, an apparatus for compressing data is provided that includes at least one processor configured to decorrelate a plurality of components of multicomponent data and then encode data relating to decorrelation of the components. In this regard, the processor may be configured to decorrelate the components by organizing samples of a component into classes based upon values of samples having corresponding spatial locations in at least one preceding component. In this regard, the processor may be configured to organize the samples of a component into classes by defining classes based upon values of the samples in at least one preceding component with at least one class including at least two sample values. In addition, the processor may also be configured define classes based upon the slope of the samples in at least two preceding components.

The processor of one embodiment may be configured to decorrelate the components by first determining residual values for each of a plurality of samples of a component (such as by computing each residual as the difference between a prediction of the value of the sample and the actual value of the sample, where the prediction is a function of the value(s) of the sample(s) having corresponding spatial locations in at least one preceding component), secondly determining a mean of the residual values for the samples of a respective class and finally offsetting the residual values for the samples of the respective class by the mean. In addition, the processor of this embodiment may be configured to cause the mean for each of a plurality of classes to be transmitted as side information. Alternatively, the processor may estimate, such as by recursive estimation, the mean in accordance with backward adaptive estimation, thereby avoiding transmission of the mean for each of the plurality of classes as side information. In some embodiments, the processor may be configured to decorrelate the components by adapting to local spatial characteristics, including, for example, the use of scan sequences tailored to preserve locality of the backward adaptive estimation process.

In a further embodiment, a computer program product is provided that includes at least one computer-readable storage medium having computer-executable program code instructions stored therein. The computer-executable program code instructions include program code instructions configured to decorrelate a plurality of components of multicomponent data and program code instructions configured to then encode data relating to decorrelation of the components. In this regard, the program code instructions configured to decorrelate the components may include program code instructions configured to organize samples of a component into classes based upon values of samples having corresponding spatial locations in at least one preceding component. In this regard, the program code instructions may be configured to organize the samples of a component into classes by defining classes based upon values of the samples in at least one preceding component with at least one class including at least two sample values. In addition, the program code instructions may also be configured define classes based upon the slope of the samples in at least two preceding components.

The program code instructions that are configured to decorrelate the components may include program code instructions configured to first determine residual values for each of a plurality of samples of a component (such as by computing each residual as the difference between a prediction of the value of the sample and the actual value of the sample, where the prediction is a function of the value(s) of the sample(s) having corresponding spatial locations in at least one preceding component), program code instructions configured to secondly determine a mean of the residual values for the samples of a respective class, and program code instructions configured to finally offset the residual values for the samples of the respective class by the mean. In addition, the program code instructions of this embodiment may be configured to cause the mean for each of a plurality of classes to be transmitted as side information. In some embodiments, the program code instructions configured to decorrelate the components may adapt to local spatial characteristics, such as by estimating the mean of the residual values for each class using a backward adaptive estimation process, including, for example, the use of scan sequences tailored to preserve locality of the backward adaptive estimation process.

The features, functions and advantages that have been discussed may be achieved independently in various embodiments of the present disclosure and may be combined in yet other embodiments, further details of which may be seen with reference to the following description and drawings.

BRIEF DESCRIPTION OF THE SEVERAL VIEWS OF THE DRAWING(S)

Having thus described embodiments of the present disclosure in general terms, reference will now be made to the accompanying drawings, which are not necessarily drawn to scale, and wherein:

Figure 7:
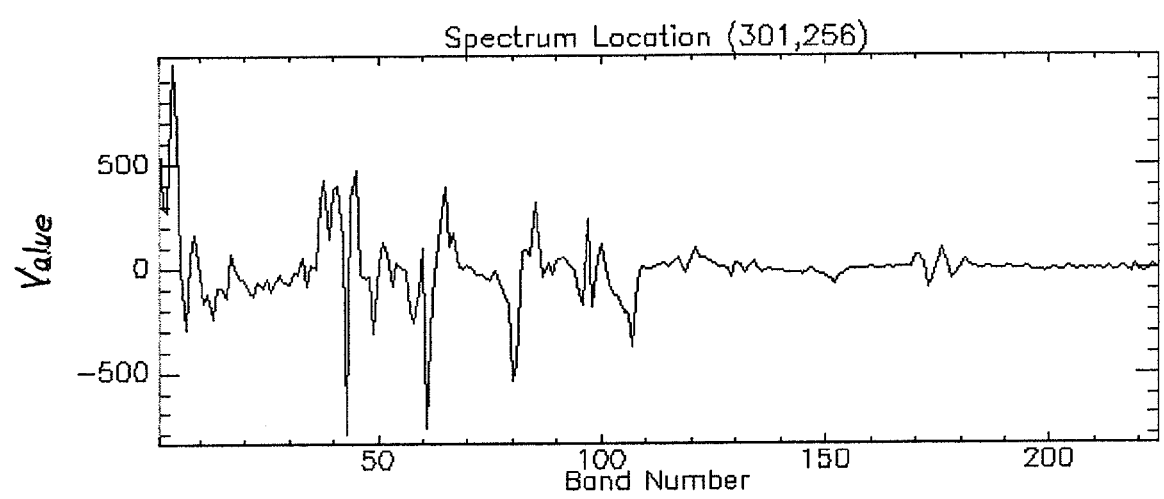
FIG. 7 illustrates the residuals that remain following a first order linear prediction on a spectral profile for a predefined spatial location.
Figure 9:
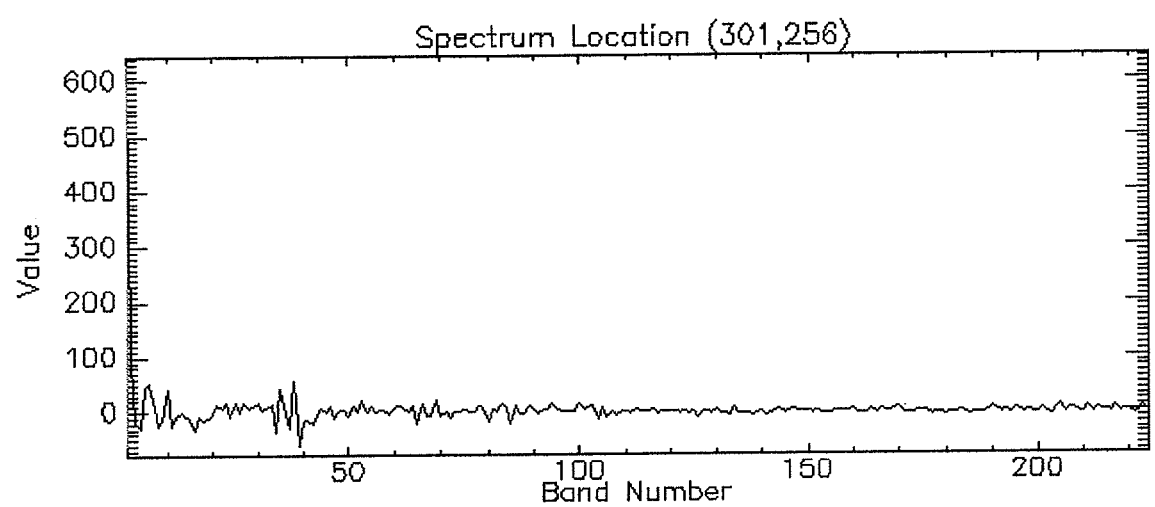
Figure 10:
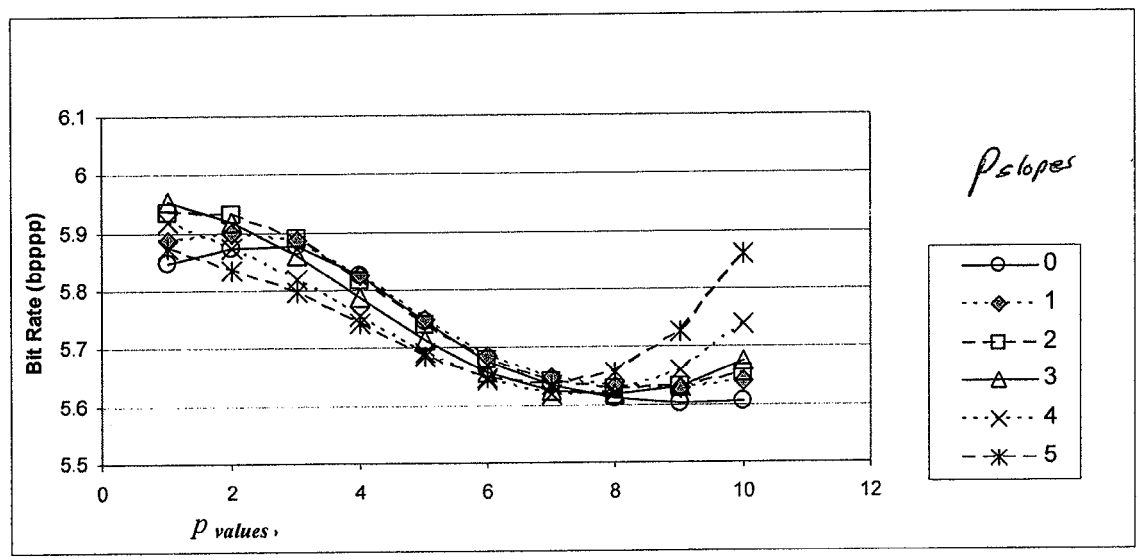

FIG. 9 illustrates the effect of having offset the residuals of FIG. 7 with the mean of the value class to which each respective pixel belongs in which the pixels are classified based upon a combination the values and the slope of the corresponding pixels in a preceding spectral band in accordance with another embodiment of the present disclosure; and FIG. 10 illustrates the overall compression performance for spectral decorrelation using a classification scheme based upon the values of the pixels and the slopes of the pixels in the preceding spectral band following removal of the zero values in accordance with one embodiment of the present disclosure.

DETAILED DESCRIPTION

The present disclosure now will be described more fully hereinafter with reference to the accompanying drawings, in which some, but not all embodiments are shown. Indeed, these embodiments may have many different forms and should not be construed as limited to those set forth herein; rather, these embodiments are provided so that this disclosure will satisfy applicable legal requirements. Like numbers refer to like elements throughout.

Figure 1:
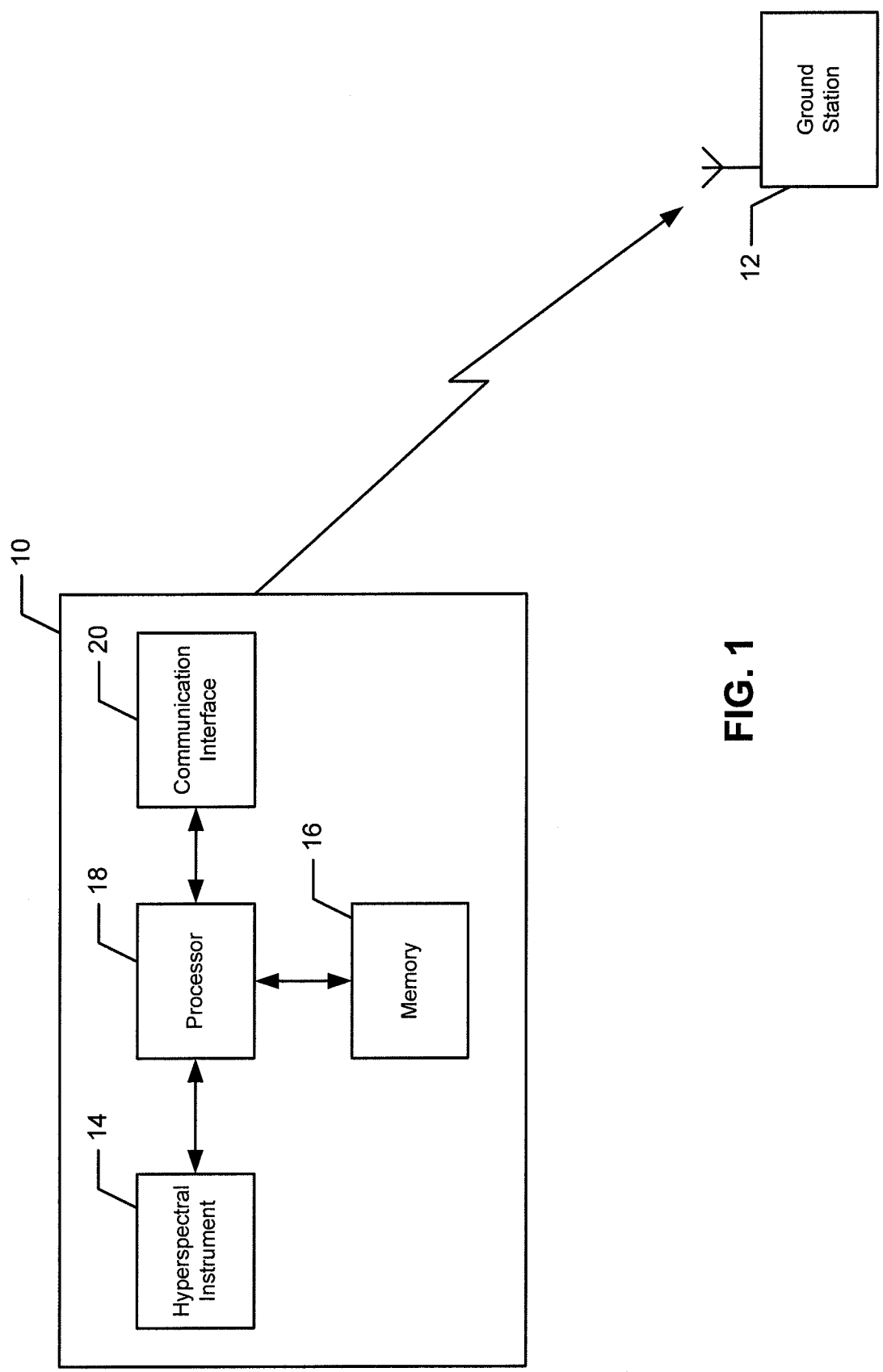
FIG. 1 is a block diagram of an apparatus according to embodiments of the present disclosure.

A method, apparatus and computer program product are provided for compressing data. While various types of data may be compressed, an example embodiment of the method, apparatus and computer program product will be described herein in conjunction with the compression of hyperspectral image data. For example, hyperspectral image data may be obtained by a collection platform 10, such as an aircraft, satellite or the like, and then transmitted offboard, such as to a ground station 12, as shown in FIG. 1. It is noted, however, that hyperspectral image data is utilized for purposes of illustration and not of limitation. Thus, while image data comprising a plurality of spectral bands is discussed below, the method, apparatus and computer program product may compress any type of multicomponent data arranged in individual components and need not merely compress image data arranged in spectral bands.

Hyperspectral imagery may be utilized in many applications. However, hyperspectral imagery is well suited to identify different materials since the different materials generally have different spectral signatures. For example, aerial imagery of the underlying terrain may be able to individually identify different materials, such as water, vegetation, buildings and the like, based upon their various spectral signatures. As such, certain embodiments of the method, apparatus and computer program product that are described below are discussed in conjunction with the processing of a hyperspectral image that is the product of the interrogation of different materials.

As noted above, a hyperspectral image may be organized as a cube. The hyperspectral cube may have crosstrack, downtrack, and spectral dimensions that are represented using the letters C, D, and S, respectively, as a result of the sequence in which the imagery is generated by a hyperspectral instrument 14 onboard the collection platform 10. Hyperspectral image cubes typically come in one of three possible interleave formats: band sequential (BSQ), band interleaved line (BIL) and band interleaved pixel (BIP). In BSQ, the crosstrack spatial coordinates vary most rapidly, followed by the downtrack spatial coordinates, and finally the spectral coordinates. Thus, the ordering of dimensions for the BSQ format is CDS. In BIL, the crosstrack spatial coordinates vary most rapidly, followed by the spectral coordinates, and finally the downtrack spatial coordinates. Thus, the ordering of dimensions for the BIL format is CSD. In BIP, the spectral coordinates vary most rapidly, followed by the crosstrack spatial coordinates, and finally the downtrack spatial coordinates. Thus, the ordering of dimensions for the BIP format is SCD.

The interleave format for any particular hyperspectral image often depends on the type of instrument used to collect the imagery, e.g., interferometric or dispersive. For example, the AVIRIS data is nominally stored in BIP format, because the AVIRIS hyperspectral instrument 14 is a collector that includes sensors that operate in a pushbroom fashion, collecting a sequence of image squares that each have crosstrack dimension of 614 and a spectral dimension of 224. These image squares are successively collected along a downtrack dimension which is typically 512. However, hyperspectral image data may be converted between the BSQ, BIP, and BIL formats, if so desired.

By convention, the axes of a stored hyperspectral cube are identified as X, Y, and Z, and the data may be stored in memory 16 so that the X coordinates vary most rapidly, followed by the Y and Z coordinates. In order to facilitate efficient retrieval and handling of the data, the inter-component decorrelation may be applied along the axis with the most slowly varying coordinate, that is, along the Z-axis. This approach is driven by the desire to handle the image data incrementally, minimizing memory requirements and handling of the data. Such approaches can potentially eliminate the need to buffer the entire cube which may be especially beneficial for downlink compression applications on airborne or spaceborne platforms with constraints on the size, weight, and power of compression hardware. In order to apply inter-component decorrelation in the spectral dimension as described below, the BSQ format with CDS ordering of the hyperspectral dimensions may be advantageous so that the spectral data varies the most slowly.

Figure 2:
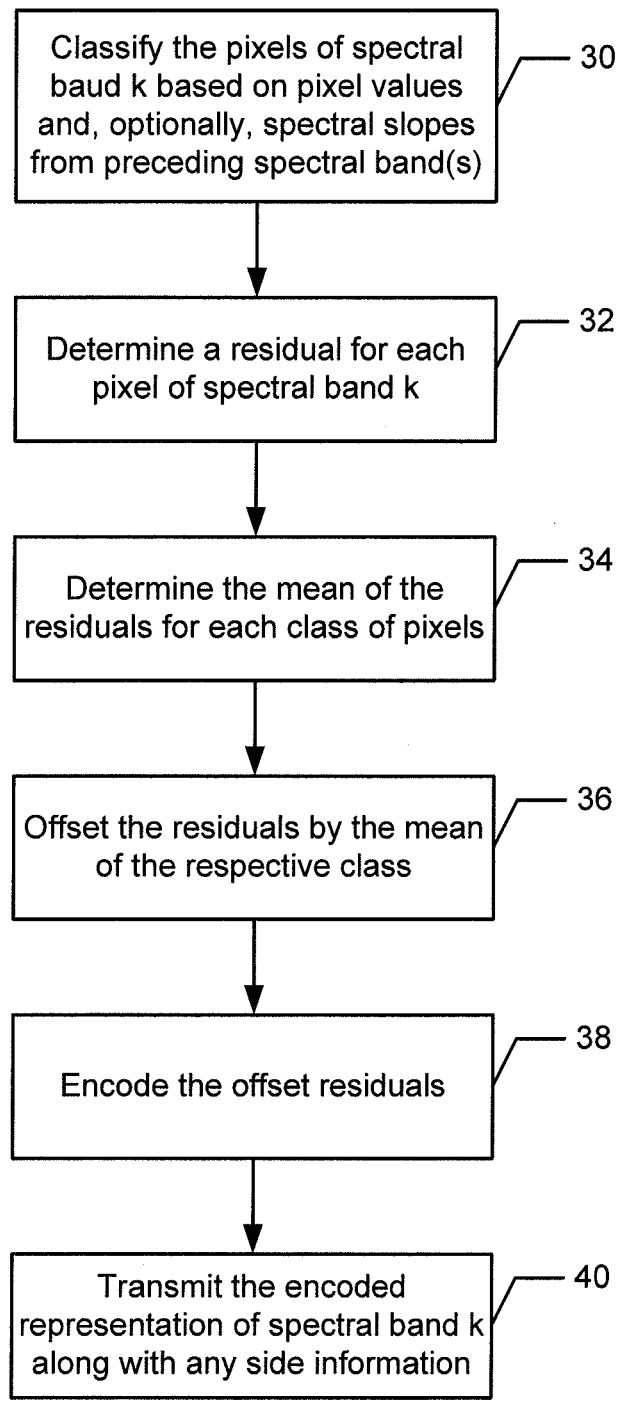
FIG. 2 is a flowchart of operations performed in accordance with embodiments of the present disclosure.

In accordance with embodiments of the present disclosure, the method, apparatus and computer program product may compress the data by decorrelating the data, such as by applying inter-component decorrelation in the spectral dimension, and then encoding the decorrelated data. See, for example, FIG. 2. Although the apparatus for compressing the data may be configured in various manners, the apparatus of one embodiment is shown in FIG. 1. In this regard, the apparatus may include various means, such as a processor 18, memory 16 and communication interface 20, for performing the various functions herein described. These means of the apparatus as described herein may be embodied as, for example, circuitry, hardware elements (for example, a suitably programmed processor, combinational logic circuit, and/or the like), a computer program product comprising computer-readable program instructions (for example, software or firmware) stored on a computer-readable medium (for example, memory) that is executable by a suitably configured processing device (for example, the processor), or some combination thereof. Although the apparatus is depicted in FIG. 1 to be onboard a collection platform 10, the apparatus may be positioned elsewhere in other embodiments.

The processor 18 may, for example, be embodied as various means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an ASIC or FPGA, or some combination thereof. Accordingly, although illustrated in FIG. 3 as a single processor, in some embodiments the processor comprises a plurality of processors. The plurality of processors may be in operative communication with each other and may be collectively configured to perform one or more functionalities of the apparatus as described herein. In an example embodiment, the processor is configured to execute instructions stored in the memory or otherwise accessible to the processor. These instructions, when executed by the processor, may cause the apparatus to perform one or more of the functionalities of the apparatus as described herein. As such, whether configured by hardware or software methods, or by a combination thereof, the processor may comprise an entity capable of performing operations according to embodiments of the present disclosure while configured accordingly. Thus, for example, when the processor is embodied as an ASIC, FPGA or the like, the processor may comprise specifically configured hardware for conducting one or more operations described herein. Alternatively, as another example, when the processor is embodied as an executor of instructions, such as may be stored in the memory, the instructions may specifically configure the processor to perform one or more algorithms and operations described herein.

The memory 16 may comprise, for example, volatile memory, non-volatile memory, or some combination thereof. Although illustrated in FIG. 1 as a single memory, the memory may comprise a plurality of memories. In various embodiments, the memory may comprise, for example, a hard disk, random access memory, cache memory, flash memory, a compact disc read only memory (CD-ROM), digital versatile disc read only memory (DVD-ROM), an optical disc, circuitry configured to store information, or some combination thereof. The memory may be configured to store information, data, applications, instructions, and/or the like for enabling the apparatus to carry out various functions in accordance with example embodiments of the present disclosure. For example, in at least some embodiments, the memory is configured to store image data from the hyperspectral instrument 14 for processing by the processor 18. Additionally or alternatively, in at least some embodiments, the memory is configured to store program instructions for execution by the processor. The memory may store information in the form of static and/or dynamic information.

The communication interface 20 may be embodied as any device or means embodied in circuitry, hardware, a computer program product comprising computer readable program instructions stored on a computer readable medium (for example, the memory 16) and executed by a processing device (for example, the processor 18), or a combination thereof that is configured to receive and/or transmit data from/to another entity, such as over a network, e.g. the wireless link depicted in FIG. 1. In at least one embodiment, the communication interface is at least partially embodied as or otherwise controlled by the processor. In this regard, the communication interface may be in communication with the processor, such as via a bus. The communication interface may include, for example, an antenna, a transmitter, a receiver, a transceiver and/or supporting hardware or software for enabling communications with one or more computing devices or entities over the network. The communication interface may additionally be in communication with the memory, such as via a bus.

Figure 3:
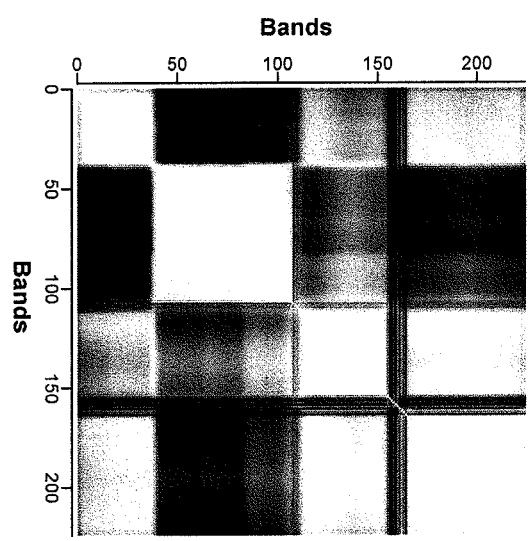
FIG. 3 illustrates the spectral correlation structure of a hyperspectral image.

Regardless of the configuration of the apparatus, spectral decorrelation can substantially benefit hyperspectral compression performance due to high inter-band redundancy along the spectral dimension and the large dynamic range in the spectral domain. The redundancy is attributable to the fine sampling of the spectrum in hyperspectral imagery, e.g., 10 nm band intervals for AVIRIS imagery. An example of this redundancy can be seen in FIG. 3, which shows the spectral correlation structure for Jasper Ridge Radiance Cube #1 of the AVIRIS data set. FIG. 3 displays the magnitudes of the correlation coefficients, with white representing a coefficient magnitude of 1 and black representing a coefficient magnitude of 0. The large areas of white, especially for proximate bands, indicate the high level of band-to-band redundancy.

Figure 4:
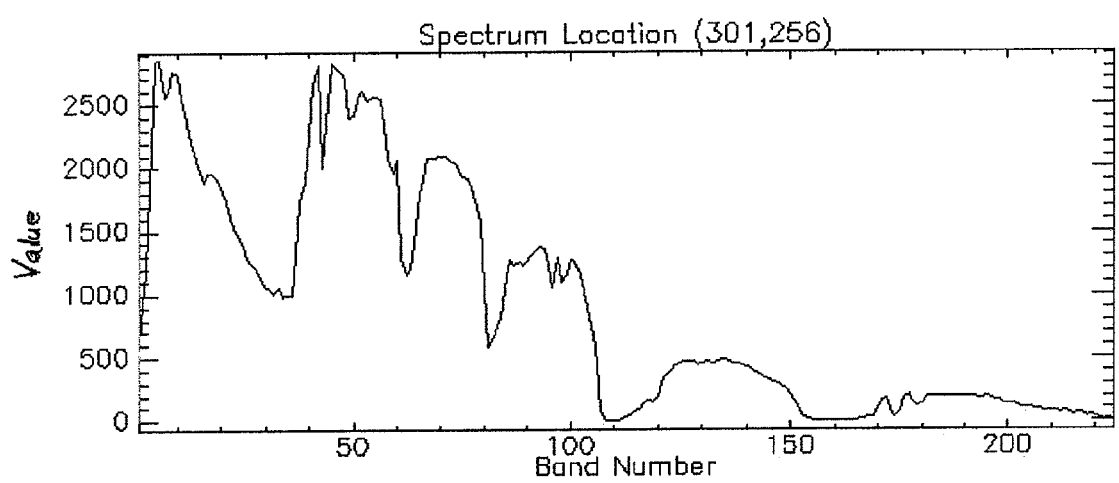
FIG. 4 illustrates the spectral profile at a particular location of a hyperspectral image.

Another perspective on the redundancy along the spectral dimension can be seen in a spectral (Z) profile (at crosstrack coordinate 301 and downtrack coordinate 256) from this same cube of the AVIRIS data set, as shown in FIG. 4. This relatively smooth profile exhibits the high level of redundancy typical in the spectral domain.

In accordance with embodiments of the present disclosure, the plurality of data components, such as spectral bands, are decorrelated by an inter-band decorrelation process that also organizes the pixels of a spectral band into classes. As described below and as shown in block 30 of FIG. 2, the classes into which the pixels of a spectral band are organized may be based upon the values of pixels having corresponding spatial locations in at least one preceding spectral band. For a hyperspectral image having a plurality of spectral bands, each pixel in spectral band k may be assigned to a spectral class based on the value of the corresponding pixel in one or more preceding spectral bands. As described below, each pixel in spectral band k may be assigned to a spectral class based on the value of the corresponding pixel in the preceding spectral band k−1. However, other embodiments of the method, apparatus and computer program product may rely upon the values of the corresponding pixel in two or more preceding spectral bands, or upon the value of the corresponding pixel from a band other than band k−1, if so desired. While the pixels in spectral band k may be separated into classes in various manners, the processor 18 of one embodiment separates the pixels in spectral band k into classes by shifting the values of the corresponding pixels in the preceding spectral band k−1 to the right. The amount by which the values of the pixels are shifted defines the granularity of the classification scheme with shifts of a small amount resulting in a more coarsely grained classification scheme than the shifts of a larger amount.

In this embodiment, the right shift produces a dyadic partition of the pixel values within spectral band k−1, i.e., a uniform partition with each interval having a width equal to a power of 2. Alternatively, the processor 18 of other embodiments may classify the pixels of spectral band k by employing a non-uniform clustering process to the values of the pixels of one or more of the preceding spectral bands. The employment of such a non-uniform clustering process may achieve advantageous spectral classification results, such as by being matched to specific material classes, but at the expense of additional computational resources.

In one embodiment, the processor 18 is configured to organize the pixels of spectral band k into classes by determining the minimum and maximum pixel values within spectral band k−1 with the difference between the minimum and maximum pixel values defining the dynamic range of pixel values. This dynamic range of pixel values is then separated into classes, such as by using a right shift operation. In one embodiment, the class number, which will be also referenced as the value class (valClass), for the pixel at coordinate (i, j) in the k-th spectral band may be determined as a function of the value of the corresponding pixel, e.g., the pixel at coordinate (i, j) in the preceding spectral band k−1 as follows:

$$valClass_k(i, j) = \text{int}\left(\frac{x_{k-1}(i, j) - minPixelValue_{k-1}}{2^{valShift_{k-1}}}\right) \quad (1)$$
$$= (x_{k-1}(i, j) - minPixelValue_{k-1}) >> valShift_{k-1}$$

where:

$$maxPixelValue_{k-1} = \max_{i,j}(x_{k-1}(i, j)) \quad (2)$$

$$minPixelValue_{k-1} = \min_{i,j}(x_{k-1}(i, j))$$

In Equation (1) as well as elsewhere herein, ">>" represents a right shift operation. Conversely, "<<" represents a left shift operation.

In one embodiment, an upper bound is established on the number of value classes for each spectral band using a parameter $p_{values}$, which may be provided by a user. Specifically, the parameter $valShift_{k-1}$ may be selected as the smallest shift for which the number of value classes will not exceed $2^{p_{values}}$ as follows:

$$valShift_{k-1} = \max(0, \lceil \log_2(maxPixelValue_{k-1} - minPixelValue_{k-1} + 1) \rceil - p_{values}) \quad (3)$$

It is noted that the notation ⌈ ⌉ in the foregoing equation indicates a ceiling operator, which rounds up to the nearest integer. The resulting shift value (valShift) guarantees that the number of value classes will not exceed $2^{p_{values}}$ or the number of pixel values. The lower bound of zero precludes a negative shift value.

The parameter $p_{values}$ provides a mechanism for trading off the amount of side information versus the resolution of classification. A larger value for $p_{values}$ will result in a finer partition of value classes and may improve the decorrelation of the spectral bands, but will also increase the amount of side information. In one embodiment, however, the classifier $p_{values}$ is set equal to 9.

Alternatively, in at least some embodiments, the valShift$_{k-1}$ parameters may be directly specified. In one such embodiment, a single parameter, which may be denoted as constantShift, may be used to specify the right shift parameter for all bands, as follows:

$$valShift_{k-1} = constantShift \quad (4)$$

This method has the effect of using the same classification granularity for all bands. Alternatively, the valShift$_{k-1}$ parameters may be directly specified for each individual band, based on a priori or empirical knowledge of band characteristics.

In addition to the classification of the pixels of the spectral band k, the method, apparatus and computer program product of embodiments of the present disclosure decorrelate the spectral bands. Although various decorrelation techniques may be employed, the processor 18 of one embodiment may employ an n-th order predictor, such as a first order non-adaptive linear predictor, to decorrelate the spectral bands. In this regard, an n-th order predictor models the Z profile, e.g., the spectral bands, as an order n polynomial, and predicts the next sample based on the n preceding samples along the Z axis. The predicted value of the pixel at coordinate (i, j) in the k-th spectral band, as a function of the pixel values at the same coordinate in the preceding spectral band is given by:

$$p_k(i, j) = \sum_{l=1}^{n} c_l x_{k-l}(i, j) \quad (5)$$

In addition, there may be another implied coefficient $c_0$ that is an offset and that is commonly omitted since its nominal value is zero.

The predictions for an order n polynomial model are based on n-th order differences, with the predictor coefficients, that is, the parameters of the predictor, derived from binomial coefficients (with alternating signs), given by:

$$c_l = \frac{(-1)^{l+1} n!}{l!(n-l)!} \quad (6)$$

In accordance with one embodiment, the method, apparatus and computer program product provide for individualized adaptation of the predictor within each class. Thus, the predictor may be adapted in one manner in one class and in another manner in another class. The predictor may be adapted by modifying the predictor coefficients in a manner that is dependent upon class. For example, the predictor coefficients may be modified in accordance with a least squares approach in order to minimize the least squared error within each class. For a first order predictor, the $c_1$ coefficient may be set to 1 and the $c_0$ offset coefficient may be set to minus the mean, which is the least squared solution. Although the predictor may be adapted in various manners, one technique for adapting the predictor within each class is described below in regards to offsetting of a residual for each pixel in accordance with the class of the pixel. In this regard and as shown in operation 32 of FIG. 2, the processor 18 may determine the residual for each pixel of spectral band k as follows:

$$r_k(i, j) = x_k(i, j) - p_k(i, j) = n! \sum_{l=0}^{n} \frac{(-1)^l x_{k-l}(i, j)}{l!(n-l)!} \quad (7)$$

At startup, the first spectral band is directly compressed without linear prediction, and the residual for the second spectral band is then determined using first order linear prediction, and so on, with the prediction order increasing for each spectral band until order n prediction is reached at spectral band n+1.

Although the spectral bands may be decorrelated utilizing higher order linear predictors or an adaptive linear predictor, such as an adaptive linear predictor in which the predictor coefficients are estimated to produce minimum mean squared residuals, the processor 18 decorrelates the spectral bands in accordance with one embodiment utilizing a first order linear predication, such that n=1. As described above, each pixel of the spectral band k has also been classified based upon the value of the pixel having the corresponding spatial location in at least one preceding spectral band, e.g., spectral band k−1. This classification may be performed either prior to or following the utilization of the first order linear prediction or other decorrelation technique. The processor of one embodiment then determines the mean of the residuals for the pixels in each value class. See operation 34 of FIG. 2. For example, the processor of one embodiment may determine the mean of the residuals for each pixel of a first value class, the mean of the residuals for each pixel of a second value class and so on. Thereafter, such as in a secondary pass through spectral band k, each residual is offset by the mean of the residuals for its respective value class, thereby adapting the predictor by class. See operation 36 of FIG. 2. For example, the mean residual for each value class may be subtracted from the residuals for the pixels of that same value class. The offsetting of the residuals by the mean of the residuals for the respective value class is intended to provide greater decorrelation than a standard linear predictor. In one embodiment, the mean residuals may be stored in a table maintained, for example, by memory 16. The value classes may serve as a class identifier that may function as an index or pointer into the table so as to identify the mean residual associated with the respective value class.

The processor 18 may then encode the resulting offset residuals for the spectral band k using any of a number of compression techniques. See operation 38 of FIG. 2. For example, the offset residuals may be encoded in a lossless manner, such as by JPEG-LS. See, for example, M. Weinberger, G. Seroussi, and G. Sapiro, "The LOCO-I Lossless Image Compression Algorithm: Principles and Standardization into JPEG-LS", *IEEE Transactions on Image Processing*, vol. 9, no. 8, pp. 1309-1324, August 2000. See also U.S. Pat. Nos. 5,850,482 and 5,680,129 as well as J. J. Meany and C. J. Martens, "Split field coding: low complexity error-resilient entropy coding for image compression," *Applications of Digital Image Processing XXX, Proceedings of SPIE*, vol. 7073, 707316, August 2008. The communication interface 20 operating under control of the processor may then transmit, store or otherwise disseminate the compressed representation of the offset residuals for the spectral band k, as shown in operation 40 of FIG. 2. In this regard, the means of the residuals for the pixels of each value class may be transmitted and/or stored as side information along with the compressed representation of the offset residuals for the spectral band k. In this regard, the compressed representation of the offset residuals for the spectral band k along with the side information forms the compressed hyperspectral image for spectral band k.

In order to recover the residuals for the spectral band k, such as following transmission, storage or other dissemination of the compressed hyperspectral image, the compressed hyperspectral image may be decoded, such as in a lossless manner, in a manner that is dependent upon the type of encoding that was utilized. The actual pixel values for spectral band k may then be recovered from the decompressed residuals for the spectral band k by processing the residuals in a manner dependent upon the decorrelation technique employed to initially define the residuals. In one example in which an n-th order linear predictor was utilized to decorrelate the spectral bands, the actual pixel values may be recovered by using the same order n polynomial model as follows:

$$x_k(i,j) = r_k(i,j) + p_k(i,j) = r_k(i,j) + n! \sum_{l=1}^{n} \frac{(-1)^{l+1} x_{k-l}(i,j)}{l!(n-l)!} \quad (8)$$

Although described above in conjunction with lossless compression techniques, some embodiments of the method, apparatus and computer program product may, instead, employ lossy compression. If lossy compression is employed, the method, apparatus and computer program product are advantageously configured to ensure that the predictions generated during the decompression process are the same as the predictions generated during the compression process. In one embodiment, the compression of the offset residuals for each spectral band is performed using a lossy image plane compression technique, such as JPEG 2000, with the predictions utilized during both the compression and decompression processes to be generated from the quantized or reconstructed spectral bands which result from lossy compression. In one embodiment, the prediction feedback loop within the compression process therefore includes a replica of the image plane decompressor in order to generate a duplicate of the reconstructed spectral bands obtained in the decompression process.

The method, apparatus and computer program product of other embodiments may classify the pixels of the spectral band in other manners. For example, the processor 18 of one embodiment may be configured to classify the pixels of the spectral band k based upon both the value and the slope of the pixels having corresponding spatial locations in the preceding spectral band(s). See operation 30 of FIG. 2. Although inter-component slope, such as spectral slope, may be determined across any number of the preceding spectral bands, the processor of one embodiment determines the slope as the difference between the pixel values having corresponding spatial locations in spectral bands k−1 and k−2 as follows:

$$\text{slope}_{k-1}(i,j) = x_{k-1}(i,j) - x_{k-2}(i,j) \quad (9)$$

Indeed, in embodiments that employ a linear predictor, the slope information may have been already determined as part of the linear prediction as shown, for example, in Equation (7).

Although the partitioning of slopes could be performed over the entire spectral band or any other predefined portion of the spectral band, the processor 18 of one embodiment partitions the slopes separately in association with each individual value class, thereby effectively classifying the pixels using pixel value and slope information. Thus, for the pixels within a respective value class as defined by the pixel values from spectral band k−1, the slope of the corresponding pixels from spectral bands k−1 and k−2 may be determined and the pixels of spectral band k that are within the respective value class may be further classified by aggregating those pixels having the same or a similar slope. The dynamic range of slopes collected over the pixels associated with an individual value class will be no greater and generally substantially smaller than the dynamic range of the slopes collected over all of the pixels in a spectral band. By separately partitioning the slopes within each value class, the resolution of the slope partitions may be tuned to the dynamic range of the slopes over the associated value class, thereby achieving good resolution on the slope partition without generating an excessive amount of side information.

In accordance of one embodiment of this technique for classifying the pixels utilizing both the value and the slope of the pixels having corresponding spatial locations in the preceding spectral band(s), the minimum and maximum pixel values, as well as the minimum and maximum slopes associated with each value class, may be determined for spectral band k−1. For computational efficiency, it would be desirable to collect these bounds on both the pixel values and the slopes during a single pass through spectral band k−1. However, in advance of the initial pass through spectral band k−1, the bounds on the pixel values are unknown and thus the manner in which the pixel values will be partitioned is also unknown. It is therefore difficult to collect the slope bounds associated with the value classes during a single pass. In order to address this difficulty, the processor 18 of one embodiment may collect the slope bounds into arrays, MinSlopes[ ] and MaxSlopes[ ], which track the minimum and maximum slope values between spectral bands k−2 and k−1 in association with a fine resolution partitioning of the pixel values:

$$MaxSlopes_{k-1}[n] = \max_{\forall i,j: int\left(\frac{x_{k-1}(i,j)}{2^{collShift}}\right)=n} (slope_{k-1}(i, j))$$

$$= \max_{\forall i,j: (x_{k-1}(i,j) >> collShift)=n} (slope_{k-1}(i, j))$$

$$MinSlopes_{k-1}[n] = \min_{\forall i,j: int\left(\frac{x_{k-1}(i,j)}{2^{collShift}}\right)=n} (slope_{k-1}(i, j))$$

$$= \min_{\forall i,j: (x_{k-1}(i,j) >> collShift)=n} (slope_{k-1}(i, j))$$

(10)

The resolution at which these slope bounds are collected is controlled by the parameter collShift, which defines the shift of the pixel value to generate the index into the arrays in which the bounds are collected. After the preliminary pass through spectral band k−1, the slope bounds collected in the MinSlopes[ ] and MaxSlopes[ ] arrays are mapped to the appropriate value classes. At this point, the partitioning of the pixel values used during the collection of the slope bounds may not, in general, map into the partitioning of pixel values into value classes, as defined in Equation (1). This mapping mismatch may be due to the fact that the shift operation used in Equation (1) is applied to the pixel values after the minimum pixel value has first been subtracted, while the shift operation used in Equation (10) is applied directly to the pixel value. To insure proper mapping, the processor 18 of one embodiment may partition the pixel values into value classes in a modified manner as follows:

$$valClass_k(i, j) = int\left(\frac{x_{k-1}(i,j)}{2^{valShift_{k-1}}}\right) - int\left(\frac{minPixelValue_{k-1}}{2^{valShift_{k-1}}}\right)$$

$$= (x_{k-1}(i, j) >> valShift_{k-1}) -$$

$$(minPixelValue_{k-1} >> valShift_{k-1})$$

(11)

The slope bounds collected using Equation (10) can now be mapped into the partition of the pixel values defined by Equation (11). If collShift is equal to valShift$_{k-1}$, then the collected slope bounds map directly to the value classes. If collShift is less than valShift$_{k-1}$, then the slope bounds are collected at a finer resolution than the value classes and may be aggregated into the value classes. If collShift is greater than valShift$_{k-1}$, then the slope bounds are collected at a coarser resolution than the value classes, so that a particular set of slope bounds maps to multiple value classes.

The upper bound for the number of value classes within each spectral band is controlled by the parameter p$_{values}$. In one embodiment, valShift$_{k-1}$ is selected to be the smallest shift for which the number of value classes will not exceed $2^{p_{values}}$. A nominal value for this shift may be determined in a manner analogous to Equation (3) as follows:

nominalShift=max(0,⌈log$_2$(maxPixelValue$_{k-1}$−minPixelValue$_{k-1}$+1)⌉−p$_{values}$) (12)

However, due to the fact that the value class in Equation (11) is determined using two separate right shift operations, this could result in more than $2^{p_{values}}$ distinct value classes. To remedy this possibility, the shift amount is conditionally increased in the manner set forth below so as to maintain the total number of value classes at $2^{p_{values}}$ or less:

if (((minPixelValue$_{k-1}$>>nominalShift)−(minPixelValue$_{k-1}$>>nominalShift)+1)>$2^{p_{values}}$)
    valShift$_{k-1}$=nominalShift+1 else valShift$_{k-1}$=nominalShift (13)

Using the slope bounds which are mapped to each value class, the second element of the classification, slopeClass$_k$ may be determined. In this regard, slopeClass$_k$ may be determined in accordance with one embodiment as follows:

$$slopeClass_k(i, j) = int\left(\frac{slope_{k-1}(i, j) - minSlope_{k-1}(valClass_k(i, j))}{2^{slopeShift_{k-1}(valClass_k(i,j))}}\right)$$

$$= (slope_{k-1}(i, j) - minSlope_{k-1}(valClass_k(i, j))) >>$$

$$slopeShift_{k-1}(valClass_k(i, j))$$

(14)

The maximum number of slope classes per value class may be controlled by the parameter p$_{slopes}$, with the slopeShift$_{k-1}$( ) parameters chosen in accordance with one embodiment so that the number of slope classes within each value class will not exceed $2^{p_{slopes}}$ as follows:

slopeShift$_{k-1}$(valClass$_k$(i,j))=max(0,⌈log$_2$(maxSlope$_{k-1}$(valClass$_k$(i,j))−minSlope$_{k-1}$(valClass$_k$(i,j)))⌉−p$_{slopes}$) (15)

Alternatively, in at least some embodiments, the slopeShift$_{k-1}$( ) parameters may be directly specified. In one such embodiment, a single parameter, which may be denoted as constantSlopeShift, may be used to specify the right slope shift parameter used within all value classes in all bands, as follows:

slopeShift$_{k-1}$( )=constantSlopeShift (16)

This method has the effect of using the same slope classification granularity for value classes in all bands. Alternatively, the slopeShift$_{k-1}$( ) parameters may be individually specified, based on a priori or empirical knowledge of band characteristics.

The final classification, termed subClass, for each pixel of spectral band k is dependent in one embodiment upon a combination of the value class and slope class information. For example, the subClass for each pixel of spectral band k may be determined in one embodiment as follows:

subClass$_k$(i,j)=(valClass$_k$(i,j)<<p$_{slopes}$)+slopeClass$_k$(i, j) (17)

As will be recognized, the left shifting of the value class effectively concatenates the value class and the slope class information. In other embodiments, the value class and the slope class information may be combined in other manners.

The parameters for the classifier, p$_{values}$ and p$_{slopes}$, support a trade off between the amount of side information versus the resolution of classification. In one embodiment, however, the classifiers, p$_{values}$ and p$_{slopes}$, are set equal to 8 and 3, respectively. In another embodiment, the classifiers, p$_{values}$ and p$_{slopes}$, are set equal to 6 and 4, respectively. As in the embodiment that relies only upon pixel values for classification, the preliminary residual values for spectral band k may be determined, such as in accordance with a first order non-adaptive linear predictor, such as by using Equation (7) with n=1. See operation 32 of FIG. 2. During the same pass, each pixel may also be classified based on the pixel values and slopes from the preceding spectral band(s). See operation 30. The means of the residuals may be determined for each sub-class. See operation 34. In a secondary pass through spectral band k, each residual may be offset by the mean of the residuals in the respective sub-class. See operation 36. Following encoding of the offset residual values, the list of mean residual values may then be transmitted, stored or otherwise disseminated as part of the compressed hyperspectral image, to be used during decompression to recover the true residuals. See operations 38 and 40. As described above, the means of the residuals may be stored in a table maintained, for example, by memory 16 in one embodiment. The subClass may serve as a class identifier that may function as an index or pointer into the table so as to identify the mean residual associated with the respective subClass.

Although embodiments of the method, apparatus and computer program product have been described in which the pixels of spectral band k are classified based upon the values of the corresponding pixels from spectral band k−1 and the slope of the corresponding pixels between spectral bands k−1 and k−2, the classification of the pixels of spectral band k may be based upon the pixel values and/or slope of additional or different spectral bands in accordance with other embodiments.

In order to evaluate the performance of embodiments of the present disclosure, thirty five AVIRIS images were losslessly compressed utilizing a classification scheme based upon the values and the slope of the pixels in the preceding spectrum band. The AVIRIS images were each configured as a cube having 224 spectral bands with 10 nm band intervals and with a crosstrack dimension of 614 samples and a downtrack dimension of 512 lines. Each pixel was stored as a 16 bit signed integer such that each cube consisted of 70,418,432 pixels in 140,836,864 bytes. In its uncompressed form, the thirty five images occupy about 5 GBytes of storage.

Figure 5:
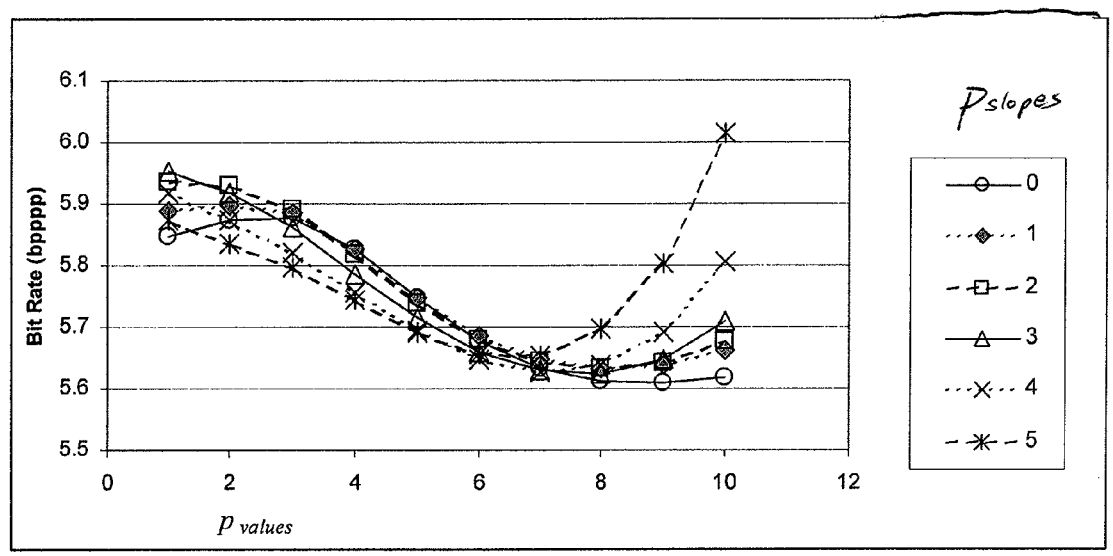
FIG. 5 illustrates the overall compression performance for spectral decorrelation using a classification scheme based upon the values of the pixels and the slopes of the pixels in the preceding spectral band in accordance with one embodiment of the present disclosure.

As shown in FIG. 5, the overall compression performance for spectral decorrelation using a classification scheme based upon the values of the pixels and the slopes of the pixels in the preceding spectrum band is shown in the curve plots. The individual curves in FIG. 5 show the compression performance for settings of the $p_{slopes}$ parameter ranging from 0 to 5, while the horizontal axis spans settings for the $p_{values}$ parameter ranging from 1 to 10. The vertical axis represents the bit rate in bits per pixel per plane such that smaller values represent greater compression. The bit rate takes into account both the bits utilized to represent the compressed spectral band, but also the side information that is generated. As shown, increases in the resolution of the classifier (with respect to both pixel values and slopes) provide improved image coding at the cost of increased side information.

Figure 6:
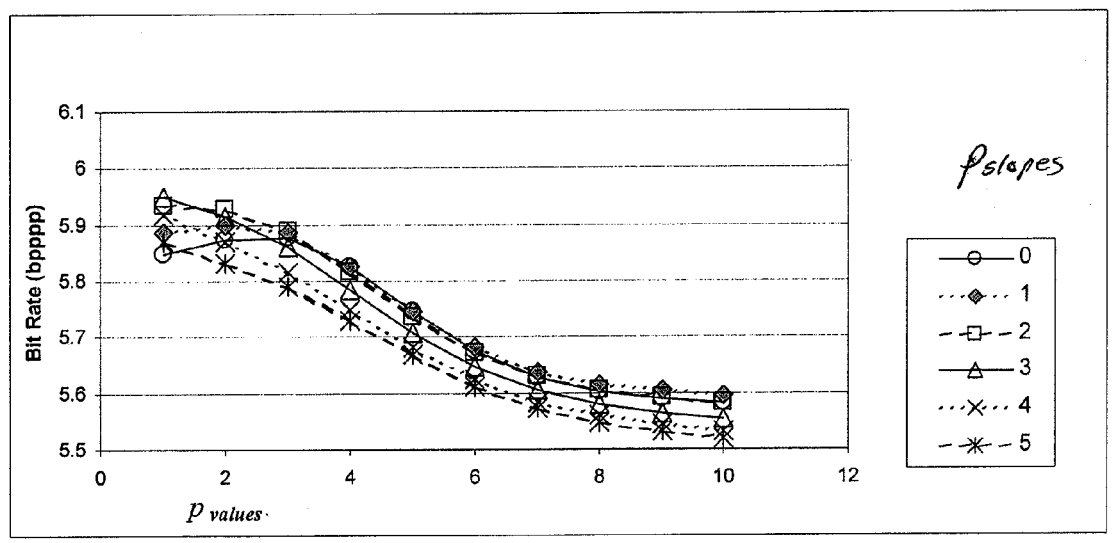
FIG. 6 illustrates the overall compression performance following the removal of the side information for spectral decorrelation using a classification scheme based upon the values of the pixels and the slopes of the pixels in the preceding spectral band in accordance with one embodiment of the present disclosure.

The effects of a classification scheme based upon the values of the pixels and the slopes of the pixels in the preceding spectrum band can be more clearly seen in FIG. 6, where the bit rates are shown with the side information omitted. The benefits of higher classifier resolutions are clear, with the best performance being achieved by the very highest classifier resolution (i.e., $p_{values}=10$ and $p_{slopes}=5$). Unfortunately, the amount of side information increases exponentially with respect to the $p_{values}$ and $p_{slopes}$ parameters.

Figure 8:
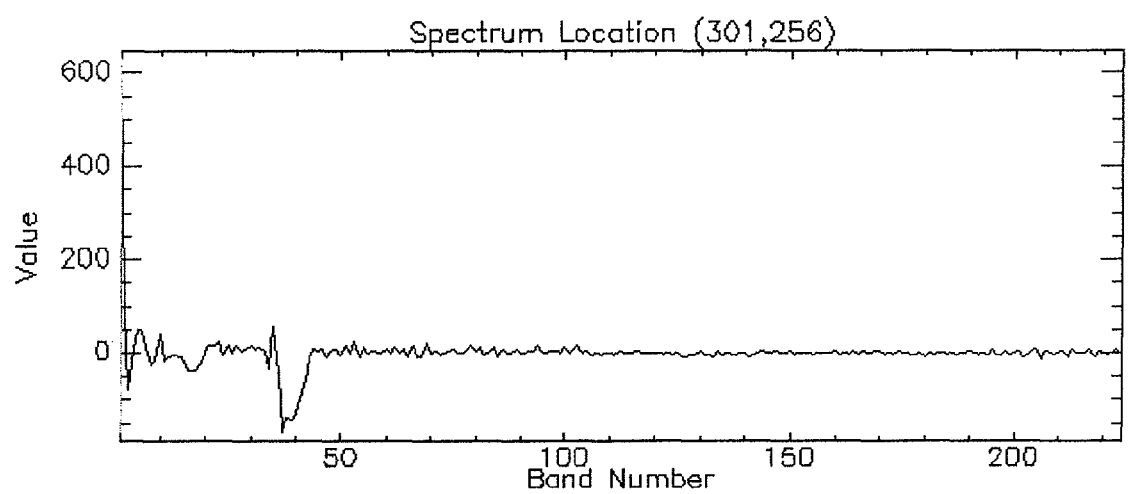
FIG. 8 illustrates the effect of having offset the residuals of FIG. 7 with the mean of the value class to which each respective pixel belongs in which the pixels are classified based upon the values of the corresponding pixels in a preceding spectral band in accordance with one embodiment of the present disclosure.

The effects of a classification scheme based upon the values of the pixels and, in some instances, the slopes of the pixels in the preceding spectrum band can be even more dramatically seen in the example spectral profiles shown in FIGS. 7-9. In this regard, FIG. 7 shows the results of first order linear prediction on the spectral profile from crosstrack coordinate 301 and downtrack coordinate 256 of the Jasper Ridge Radiance Cube #1 of the AVIRIS images. This plot represents the residuals of the spectral profile that remain after first order prediction. When these residuals are compensated using the mean residuals obtained from classification scheme that is based upon the values of the pixels in the preceding spectrum band with $p_{values}=9$ but without consideration of the slopes, the result is depicted in FIG. 8.

The downward excursion that occurs between spectral bands 33 and 43 in FIG. 8 corresponds to the abrupt upward and downward transitions within the original spectrum displayed in FIG. 7. The degraded decorrelation performance in these bands is primarily due to the fact that during these extreme transitions, the spectral values for multiple material classes cross or overlap. Indeed, these different materials may have unique spectral profiles which nevertheless have similar values (but different slopes) within certain spectral bands. In such cases, these distinct materials may be classified into the same value class and the mean residual for that value class would be a mixture over these material classes. In other words, multiple material classes may be lumped together into a single value class, and the compensation value for that value class is a mean residual value computed over all of these material classes. The mean residual value computed over multiple classes may not provide an appropriate compensation value for any of the material classes, which degrades decorrelation performance.

By classifying the pixels not only based upon the values of the pixels in the preceding spectral band, but also the slopes over the preceding spectral bands, this phenomenon that led to degraded decorrelation performance may be addressed. In this regard, FIG. 9 shows the result when the residuals of the first order predictor are compensated using the mean residuals obtained from a classification scheme based upon the values of the pixels and the slopes of the pixels in the preceding spectrum band with $p_{values}=10$ and $p_{slopes}=5$. In FIG. 9, most of the downward excursion between bands 33 and 43 is eliminated, and the average bit rate with side information omitted reaches the best result of 5.5194.

Unfortunately, the high classifier resolution comes at the cost of a substantial increase in side information. Modest improvement may be achieved by simply omitting zero values from the side information, that is, by omitting zero values from the lists of mean residual values. The zeroes within the side information can be located and eliminated during both compression and decompression with minimum computational cost. The results of a simulation in which the zero values are omitted which illustrates the improved compression performance is shown in FIG. 10.

While packing the side information does improve the bit rates, the cost of side information remains a factor. In this regard, the cost of the side information is relative to the spatial dimensions of the image cube. Thus, larger images may be able to afford more side information and higher classifier resolution, while smaller images may be handled best with lower classifier resolution. The cost of side information may also be relatively greater in the case of lossy compression, which will have lower overall bit rates. Thus, lossy compression may also require the use of lower classifier resolution.

As described above, FIG. 2 is a flowchart of an apparatus, method, and computer program product according to exemplary embodiments of the disclosure. As also described above, each block of the flowchart, and combinations of blocks in the flowchart, may be implemented by various means, such as hardware and/or a computer program product comprising one or more computer-readable mediums having computer readable program instructions stored thereon. For example, one or more of the procedures described herein may be embodied by computer program instructions of a computer program product. In this regard, the computer program product that is executed by the apparatus to perform the operations of FIG. 2 may be stored by the memory device 16 and executed by the processor 18. As will be appreciated, any such computer program product may be loaded onto a computer or other programmable apparatus to produce a machine, such that the computer program product including the instructions which execute on the computer or other programmable apparatus creates means for implementing the functions specified in the flowchart block(s). Further, the computer program product may comprise one or more computer-readable memories on which the computer program instructions may be stored such that the one or more computer-readable memories can direct a computer or other programmable apparatus to function in a particular manner, such that the computer program product comprises an article of manufacture which implements the function specified in the flowchart block(s). The computer program instructions of one or more computer program products may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions for performing the specified functions. It will also be understood that one or more blocks of the flowchart, and combinations of blocks in the flowchart, may be implemented by special purpose hardware-based computer systems which perform the specified functions or combinations of special purpose hardware and computer program product(s).

In the embodiment described above, the mean of the residuals for each class of pixels is determined utilizing forward adaptive estimation in which the residuals are determined for each pixel of an entire spectral band k with the means then determined based upon all of the residuals for each class of pixels across the entire spectral band k. In addition, to ensure that the mean residual values utilized during the decompression process are the same as those utilized during the compression process, the mean residual values for all classes of pixels in spectral band k may be transmitted as side information.

Alternatively, the mean of the residuals for each class of pixels may be estimated by the processor 18 utilizing a backward adaptive estimation technique. In this regard, the means may be estimated on the fly as the residuals are determined for each pixel across spectral band k. In this regard, the mean estimate for each class of pixels may be set to an initial value, such as 0. As the residuals for each pixel are determined, the class of the pixel is determined and the mean estimate for the respective class is then updated by taking into account the value for the residual of the current pixel and the prior value of the mean estimate for the respective class. In one embodiment, the mean estimate may be determined so as to be a weighted average by employing, for example, a forgetting factor. In this embodiment, the contributions to the mean estimate that were provided by the most recently determined residuals may be weighted more greatly and may, therefore, contribute more to the mean estimate than residuals that were determined longer ago. Once a residual is computed, the residual value may be offset by the prior value of the mean estimate for the respective class, as estimated with respect to previous instances of that class, and then the mean estimate may be updated to include the effect of the new residual value. The use of the prior value of the mean value to offset the residual ensures that the estimation process is causal, and that the estimation process in both the compressor and decompressor may remain synchronized.

By determining the mean on the fly, the means of the residuals need not be provided as side information, thereby permitting further improvement in the overall compression ratio. Instead, the means may be separately determined utilizing backward adaptive estimation by both the processor 18 of the collection platform 10 and the recipient, such as the ground station 12 in the embodiment of FIG. 1.

As a causal process, the backward adaptive estimation of the means of the residuals is sensitive to the sequence in which the pixels in spectral band k are processed. In one embodiment, the scan sequence for determining residuals and estimating the means of the residuals for the respective pixel classes may be performed in accordance with a raster scan of spectral band k. Alternatively, in other embodiments, the scan sequence may be performed in accordance with a modified scan which preserves the "locality" or spatial proximity of samples within the scan sequence. The modified scan may conform to a zig-zag raster scan, or may be modified to subdivide spectral band k into spatial subsets, or alternatively the scan may be defined in accordance with a space-filling curve, such as a Peano scan, a Hilbert scan, or a hierarchical scan. See, for example, C. Gotsman and M. Lindenbaum, "On the Metric Properties of Discrete Space-Filling Curves," *IEEE Transactions on Image Processing*, vol. 5, no. 5, pp. 794-797, 1996; or N. Memon, D. L. Neuhoff, and S. Shende, "An Analysis of Some Common Scanning Techniques for Lossless Image Coding," *IEEE Transactions on Image Processing*, vol. 9, no. 11, pp. 1837-1848, 2000. A modified scan which preserves locality of samples within the sequence allows for improved adaptation of the estimation of the means of the residuals to local spatial characteristics.

Many modifications and other embodiments will come to mind to one skilled in the art to which these embodiments pertain having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. For example, while image data comprising a plurality of spectral bands was discussed below, the method, apparatus and computer program product may compress any type of multicomponent data arranged in components and need not merely compress image data arranged in spectral bands. Additionally, while the predictor was adapted within each class by offsetting the residuals for each class in the foregoing embodiments, the predictor may be adapted within each class in other manners, if so desired. Although specific terms are employed herein, they are used in a generic and descriptive sense only and not for purposes of limitation.

That which is claimed:

1. A method of compressing data comprising:
    decorrelating a plurality of components of multicomponent data with a processor, wherein decorrelating the components includes organizing samples of a component into classes based upon values of samples having corresponding locations in at least one preceding component with at least one class including at least two sample values; and
    encoding data relating to decorrelation of the component.

2. A method according to claim 1 wherein organizing samples of a component into classes comprises defining classes based upon values of the samples in at least one preceding component.

3. A method according to claim 2 wherein organizing samples of a component into classes further comprises defining classes based upon slope of the samples in at least two preceding components.

4. A method according to claim 1 wherein decorrelating the components further comprises determining residual values for each of a plurality of samples of the component, determining a mean of the residual values for the samples of a respective class and offsetting the residual values for the samples of the respective class by the mean.

5. A method according to claim 4 further comprising transmitting the mean for each of a plurality of classes as side information.

6. A method according to claim 4 wherein determining a mean comprises estimating the mean in accordance with backward adaptive estimation.

7. A method according to claim 6 wherein decorrelating the components further comprises adapting to local spatial characteristics.

8. An apparatus for compressing data comprising:
at least one processor configured to decorrelate a plurality of components of multicomponent data, wherein the at least one processor is configured to decorrelate the components by organizing samples of a component into classes based upon values of samples having corresponding spatial locations in at least one preceding component with at least one class including at least two sample values, and wherein the at least one processor is further configured to encode data relating to decorrelation of the components.

9. An apparatus according to claim 8 wherein the processor is configured to organize samples of a component into classes by defining classes based upon values of the samples in at least one preceding component.

10. An apparatus according to claim 9 wherein the processor is configured to organize samples of a component into classes by further defining classes based upon slope of the samples in at least two preceding components.

11. An apparatus according to claim 8 wherein the processor is configured to decorrelate the components by determining residual values for each of a plurality of samples of the component, determining a mean of the residual values for the samples of a respective class and offsetting the residual values for the samples of the respective class by the mean.

12. An apparatus according to claim 11 wherein the processor is further configured to cause transmission of the mean for each of a plurality of classes as side information.

13. An apparatus according to claim 11 wherein the processor is further configured to estimate the mean by determining the mean in accordance with backward adaptive estimation.

14. An apparatus according to claim 13 wherein the processor is further configured to decorrelate the components by adapting to local spatial characteristics.

15. A computer program product comprising at least one non-transitory computer-readable storage medium having computer-executable program code instructions stored therein, the computer-executable program code instructions comprising:
program code instructions configured to decorrelate a plurality of components of multicomponent data with a processor, wherein the program code instructions configured to decorrelate the components include program code instructions configured to organize samples of a component into classes based upon values of samples having corresponding spatial locations in at least one preceding component with at least one class including at least two sample values; and
program code instructions configured to encode data relating to decorrelation of the components.

16. A computer program product according to claim 15 wherein the program code instructions configured to organize samples of a component into classes comprise program code instructions configured to define classes based upon values of the samples in at least one preceding component.

17. A computer program product according to claim 16 wherein the program code instructions configured to organize samples of a component into classes further comprise program code instructions configured to define classes based upon slope of the samples in at least two preceding components.

18. A computer program product according to claim 15 wherein the program code instructions configured to decorrelate the components further comprise program code instructions configured to determine residual values for each of a plurality of samples of the component, determine a mean of the residual values for the samples of a respective class and offset the residual values for the samples of the respective class by the mean.

19. A computer program product according to claim 18 further comprising program code instructions configured to cause transmission of the mean for each of a plurality of classes as side information.

20. A computer program product according to claim 15 wherein the program code instructions configured to decorrelate the components further comprise program code instructions configured to adapt to local spatial characteristics.

* * * * *